US008248180B2

(12) United States Patent
Podell

(10) Patent No.: US 8,248,180 B2
(45) Date of Patent: Aug. 21, 2012

(54) BALUN WITH INTERMEDIATE CONDUCTOR

(75) Inventor: Allen F. Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 305 days.

(21) Appl. No.: 12/787,121

(22) Filed: May 25, 2010

(65) Prior Publication Data

US 2010/0301963 A1 Dec. 2, 2010

Related U.S. Application Data

(60) Provisional application No. 61/182,548, filed on May 29, 2009.

(51) Int. Cl.
*H03H 7/42* (2006.01)
*H01P 3/02* (2006.01)

(52) U.S. Cl. ........................................ 333/26; 333/33

(58) Field of Classification Search .................... 333/25, 333/26, 33, 236, 243
See application file for complete search history.

(56) References Cited

U.S. PATENT DOCUMENTS

| | | | | |
|---|---|---|---|---|
| 3,103,638 | A * | 9/1963 | Greuet | 333/127 |
| 3,237,130 | A | 2/1966 | Cohn | |
| 3,370,257 | A * | 2/1968 | Spierling | 333/33 |
| 3,428,886 | A * | 2/1969 | Kawashima et al. | 333/33 |
| 3,614,676 | A * | 10/1971 | Boelke | 333/26 |
| 4,222,016 | A * | 9/1980 | Stock et al. | 333/24 R |
| 4,554,518 | A * | 11/1985 | Baer | 333/33 |
| 4,825,220 | A | 4/1989 | Edward et al. | |
| 5,008,639 | A | 4/1991 | Pavio | |
| 5,121,090 | A * | 6/1992 | Garuts et al. | 333/124 |
| 5,296,823 | A | 3/1994 | Dietrich | |
| 5,304,959 | A | 4/1994 | Wisherd et al. | |
| 5,697,088 | A | 12/1997 | Gu | |
| 5,977,842 | A | 11/1999 | Brown et al. | |
| 5,982,252 | A | 11/1999 | Werlau | |
| 6,130,588 | A * | 10/2000 | Gallivan et al. | 333/25 |
| 6,150,897 | A * | 11/2000 | Nishikawa et al. | 333/26 |
| 6,285,273 | B1 | 9/2001 | Morikawa | |
| 6,294,965 | B1 | 9/2001 | Merrill et al. | |
| 6,750,752 | B2 | 6/2004 | Werlau | |
| 6,914,512 | B2 | 7/2005 | Park et al. | |
| 6,982,609 | B1 | 1/2006 | McKay et al. | |
| 7,068,122 | B2 * | 6/2006 | Weng et al. | 333/26 |
| 7,274,267 | B2 | 9/2007 | Saitou et al. | |
| 7,692,512 | B2 * | 4/2010 | Podell | 333/26 |

(Continued)

OTHER PUBLICATIONS

The Southgate Amateur Radio Club, byline given as “G8MNY”; “Techtip: Coax Balun” web page; downloaded from www.southgatearc.org on Aug. 3, 2007; 2 pages.

(Continued)

*Primary Examiner* — Dean O Takaoka
(74) *Attorney, Agent, or Firm* — Kolisch Hartwell, P.C.

(57) ABSTRACT

A balun comprising first and second transmission lines having a shared intermediate conductor. The first transmission line may include first and second conductors. The first conductor may have a first end for conducting an unbalanced signal relative to a circuit ground and a second end for conducting a balanced signal. The second conductor may have first and second ends proximate the respective first and second ends of the first conductor. The first end of the second conductor is open circuited. The second transmission line may include the second conductor and a third conductor having a first end connected to circuit ground and a second end for conducting the balanced signal. A resistor may connect the second end of the second conductor to circuit ground.

21 Claims, 4 Drawing Sheets

U.S. PATENT DOCUMENTS

| | | | | |
|---|---|---|---|---|
| 7,839,232 | B2 * | 11/2010 | London | 333/26 |
| 2011/0074519 | A1 * | 3/2011 | Podell | 333/26 |

OTHER PUBLICATIONS

Microwave Encyclopedia—MICROWAVES101.COM; "Baluns" web page; http://www.microwaves101.com/encyclopedia/baluns.cfm; updated Nov. 28, 2006 and downloaded Aug. 1, 2007; 4 pages.
H.T. Kim, et al; "Ultra-wideband uniplanar MMIC balun using field transformations"; Electronics Letters vol. 42 No. 6; Mar. 16, 2006; 2 pages.
Nai-Shuo Cheng et al; "A 120-W X-Band Spatially Combined Solid-State Amplifier"; IEEE Transactions on Microwave Theory and Techniques vol. 47 No. 12 pp. 2557 through 2561; Dec. 1999; 5 pages.
Angelos Alexanian; "Planar and Distributed Spatial Power Combiners" doctoral dissertation; University of California Santa Barbara; Jun. 1997; 119 pages.
Hongming An, et al; "A 50:1 Bandwidth Cost-Effective Coupler with Sliced Coaxial Cable"; IEEE MTT-S Digest, 1996; 4 pages.
Paul Horowitz et al.; "Stubs, baluns, and transformers"; The Art of Electronics section 13.10, pp. 881 through 882, Second Edition; Copyright 1989 Cambridge University Press; 4 pages.
Valerie Illingworth, editor; Definition of the word "balun"; The Penguin Dictionary of Electronics p. 30, Second Edition; Copyright 1988 Penguin Books; 2 pages.
Kenneth J. Russell; "Microwave Power Combining Techniques"; IEEE Transactions on Microwave Theory and Techniques vol. MTT-27 No. 5 pp. 472 through 478; May 1979; 7 pages.
C.W. Gerst; "Electrically Short 90° Couplers Utilizing Lumped Capacitors"; Microwave Symposium Digest, G-MTT International vol. 67, Issue 1, pp. 58 through 62; May 1967; 5 pages.
G.D. Monteath; "Coupled Transmission Lines as Symmetrical Directional Couplers"; Proc. IEE, vol. 102, Part B, No. 3, pp. 383 through 392; May 1955; 10 pages.
Rogers Corporation; "RT/duroid 5870/5880 High Frequency Laminates" data sheet; copyright 1989 through 2006 Rogers Corporation (Revised Nov. 2006); 2 pages.

* cited by examiner

BALUN WITH INTERMEDIATE CONDUCTOR

RELATED APPLICATIONS

This application claims the benefit of U.S. Provisional Application No. 61/182,548 filed May 29, 2009, and incorporated herein by reference in its entirety for all purposes.

BACKGROUND

For certain applications, there is a need for a broadband, high power communication system. For example, in military applications a broad bandwidth is required for secure spread spectrum communication and high power is required for long range. High power broadband communication systems require high power broadband antennas. Often these antennas have an input impedance that does not match the desired transmitter or receiver with which it is used. In such circumstances, baluns can be used to transform the impedance of the antenna to the impedance of the transmitter or receiver, or to convert between an unbalanced signal and a balanced signal. When large bandwidths are desired, coaxial baluns are often used.

Simple signal sources have two terminals, a source terminal and a return terminal, where most commonly a ground plane is used for the return path. The ground plane return simplifies circuit wiring, as a single conductor and the ground plane below form a complete signal path. The voltage on the ground plane is then the reference for this signal. Often this is referred to as an "unbalanced circuit", or "single-ended circuit". In such "unbalanced circuits" when wires cross or run parallel with one another, there can be undesired coupling.

One method for reducing such coupling is to use two wires, one carrying the signal, the other carrying the return signal, with no ground plane return path. With AC signals, either wire can be considered to carry the signal, and the other to carry the return signal. To minimize coupling to other circuits, it is highly desired that the signal current flowing in the two wires be exactly the same, and 180-degrees out of phase. That is, all of the return current for one wire of the pair is carried by the other wire, and the circuit is balanced. This guarantees that no return current is carried by the ground plane. In practice, such perfectly balanced, or differential, currents are only a theoretical goal.

An amplifier that uses balanced or differential input and output connections is less likely to have oscillations caused by input and output signals coupling, and less extraneous noise introduced by the surrounding circuitry. For this reason, practically all high gain operational amplifiers are differential. A "balun" is a coupling device that converts an unbalanced source to a balanced one, and vice versa. Sometimes a balun is made with nearly complete isolation between the balanced terminals and ground. Sometimes a balun is made with each balanced terminal referenced to ground, but with equal and opposite voltages appearing at these terminals. These are both valid baluns, but in one case, the unbalanced voltage encounters high impedance to ground, making unbalanced current flow difficult, while in the other, any unbalanced current encounters a short circuit to ground, minimizing the voltage that enters the balanced circuit. Microwave baluns can be either of these types, or even a mixture of the two. In any case, one could connect 2 equal unbalanced loads to the 2 balanced terminals, with their ground terminals connected together to ground. Ideally, the unbalanced signal input to the balun would be equally distributed to the two unbalanced loads. Thus, a balun may be used as a power divider or combiner, where the two unbalanced loads or sources connected to the balanced terminals would be operating 180-degrees out of phase.

At microwave frequencies, it is very difficult to fabricate well balanced circuits, as small parasitic elements can unbalance the signals. A well balanced power divider or combiner that operates over a wide microwave bandwidth is thus a very important component, and one that supplies differential, 180-degree out-of-phase outputs is most desirable because of its independence from currents flowing in the ground plane.

BRIEF SUMMARY

In one example, a balun may include first and second transmission lines having one conductor that is shared by both transmission lines. The first transmission line may include a first conductor and a second conductor. The first conductor may have a first end for conducting an unbalanced signal relative to a circuit ground and a second end for conducting a balanced signal. The second conductor may have first and second ends. The first end of the second conductor may proximate to the first end of the first conductor. The first end of the second conductor also may be open-circuited (unconnected to the first conductor and/or unconnected to the circuit ground). The second end of the second conductor may be proximate to the second end of the first conductor. A first resistor may connect the second end of the second conductor to circuit ground. The second transmission line may include the second conductor and a third conductor. The third conductor may have a first end proximate to the first end of the second conductor and connected to the circuit ground, and a second end for conducting the balanced signal.

In some examples, the second conductor may include at least first and second spaced-apart conductor segments extending serially between the first and second ends of the second conductor. Each conductor segment may have first and second ends and be inductively coupled to the first and third conductors. The first end of each conductor segment may be closer to the first end of the first conductor than the second end of the first conductor. The first end of each conductor segment may be open-circuited. The second end of each conductor segment may be closer to the second end of the first conductor than the first end of the first conductor. The first end of the first conductor segment may be the first end of the second conductor and the second end of the second conductor segment may be the second end of the second conductor. The balun further may include a resistor connecting the second end of each conductor segment to the circuit ground.

In some examples, a balun may include first, second and third conductors. The first conductor may have a continuous length between a first end for conducting a signal relative to a circuit ground and a second end for conducting a balanced signal with a first polarity. The second conductor may be inductively coupled to the first conductor substantially along the length of the first conductor, and have first and second ends. The first end of the second conductor may be open-circuited and disposed proximate to the first end of the first conductor. The second end of the second conductor may be proximate to the second end of the first conductor. A first resistor may connect the second end of the second conductor to a circuit ground. A third conductor may have a continuous length extending between a first end proximate to the first end of the second conductor and a second end proximate to the second end of the second conductor. The first end of the third conductor may be connected to the circuit ground. The second end of the third conductor may be for conducting the balanced signal with a second polarity opposite the first polarity. The second conductor may be inductively coupled to the third conductor substantially along the length of the third conductor.

DETAILED DESCRIPTION

Figure 1:
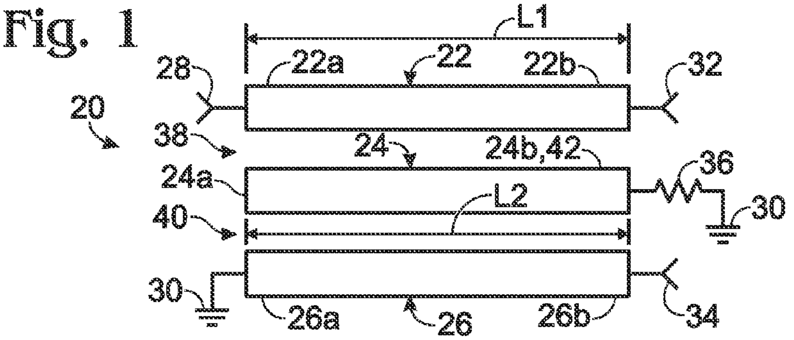
FIG. 1 is a general diagram showing a three-conductor balun.

A basic balun 20 may include a first conductor 22, a second conductor 24 and a third conductor 26. First conductor 22 has a first end 22*a* and a second end 22*b*. Similarly, second conductor 24 has a first end 24*a* and a second end 24*b*, and third conductor 26 has a first end 26*a* and a second end 26*b*. An unbalanced or single-ended signal is input or output on, and therefore conducted by, first end 22*a* of first conductor 22, represented by a port 28. The return signal is conducted on a circuit ground 30 connected to first end 26*a* of third conductor 26.

The opposite, second ends 22*b* and 26*b* of the first and third conductors 22 and 26, represented by respective ports 32 and 34, output or input (conduct) a balanced signal. Ports 32 and 34 also may conduct single-ended signals relative to circuit ground 30. Reference to "balanced" signals, ports or conductors will be understood to also refer to signals or the conducting of signals of equal amplitude and opposite polarity, and may include dual balanced single-ended signals. Ports or terminals are simply locations on the circuit where the characteristics of the circuit may be determined or observed, practically or theoretically, and do not necessarily represent structure where external circuits are connected.

In this example, the first end 24*a* of second conductor 24 is open-circuited. That is, it is not directly electrically connected to any electrically conductive component, such as circuit ground 30, or first or third conductors 22 and 26, as shown. The second end 24*b* of the second conductor 24 is connected to circuit ground through a first resistor 36.

In the conductor configuration shown in FIG. 1, the first conductor is inductively coupled to the second conductor substantially along the length L1 of the first conductor, and the third conductor is inductively coupled to the second conductor substantially along the length L2 of the third conductor. The lengths L1 and L2 may be of a suitable electrical length, such as an odd number of quarter wavelengths at a frequency of use. The first and second conductors 22 and 24 may form a first transmission line 38, and the second and third conductors 24 and 26 may form a second transmission line 40. Transmission lines 38 and 40, sharing a common conductor 24 and having the configuration shown may be of any suitable form or structure that converts between a balanced signal and an unbalanced signal. For example, balun 20 may be formed of strip conductors that are coplanar, parallel-plane, or other three-dimensional configuration. Various coaxial variations may be envisioned. For example, the second conductor may continuously or partially surround, such as be concentric around, the first (or third) conductor and the third (or first) conductor may surround the second conductor. The second conductor may surround the first and third conductors separately or jointly.

Balun 20 may be used as an impedance transformer between signal source(s) and load(s). The impedances of the balanced and unbalanced signals may be the same or they may be different. The impedances of transmission lines 38 and 40 may have respective impedances that provide appropriate impedances at the unbalanced-signal port and across the balanced signal ports. The balun may have an impedance at the unbalanced-signal port 28 that corresponds with the impedance of a circuit or transmission line attached to the balun at port 28. The impedances of the first and second transmission lines will appear to be in series between port 28 and circuit ground, so the combined impedances of the two transmission lines may be configured to correspond to the impedance of the external circuits or lines as well as any differences between the impedances of the balanced and unbalanced-signal lines and circuits.

In one example, the balanced and unbalanced signal lines may both be 50 ohms as is common in commercial circuits. If both transmission lines have individual impedances of 25-ohms, then the input and output impedances of the balun will provide reasonable match with the impedances of the external lines. Resistor 36 may have a value of about 12.5-ohms in this example.

Balun 20 may also function as a sum-difference hybrid coupler, such as a magic-T coupler. Unbalanced-signal port 28 is the difference port and balanced-signal ports 32 and 34 are the input or output ports and have signals that are 180-degrees out of phase. Second end 24*b* of conductor 24 forms a fourth, sum port 42 that is terminated through resistor 36 to ground. The termination of port 42 to ground may be used to provide a low thermal impedance path to ground for balun 20, which may increase the power-carrying capability of the circuit.

This balun may function as a sum-difference hybrid coupler with the sum port 42 terminated. In a sum-difference hybrid coupler, a signal input at the difference port 28 is divided equally between two output ports (the balanced signal ports 32 and 34 in this case) with one signal being 180-degrees out of phase from the other. The terminated sum port is isolated from the difference port and ideally does not conduct any portion of the balanced signal.

It will thus be apparent that a balun may comprise first and second transmission lines. The first transmission line may include a first conductor and a second conductor, with the first conductor having a first end for conducting a signal relative to a circuit ground and a second end for conducting a balanced signal, the second conductor having first and second ends, the first end of the second conductor being open circuited and disposed closer to the first end of the first conductor than the second end of the first conductor, unconnected to the first conductor, and unconnected to the circuit ground, the second end of the second conductor being proximate to the second end of the first conductor. A first resistor may connect the second end of the second conductor to circuit ground. The second transmission line may include the second conductor and a third conductor, the third conductor having a first end proximate to the first end of the second conductor and connected to the circuit ground and a second end for conducting the balanced signal.

In some examples, a balun may include first, second and third conductors. The first conductor may have a continuous length between a first end for conducting a signal relative to a circuit ground and a second end for conducting a balanced signal with a first polarity. The second conductor may be inductively coupled to the first conductor substantially along the length of the first conductor, and have first and second ends. The first end of the second conductor may be open-circuited and disposed proximate to the first end of the first conductor. The second end of the second conductor may be proximate to the second end of the first conductor. A first resistor may connect the second end of the second conductor to a circuit ground. A third conductor may have a continuous length extending between a first end proximate to the first end of the second conductor and a second end proximate to the second end of the second conductor. The first end of the third conductor may be connected to the circuit ground. The second end of the third conductor may be for conducting the balanced signal with a second polarity opposite the first polarity. The second conductor may be inductively coupled to the third conductor substantially along the length of the third conductor.

Figure 2:
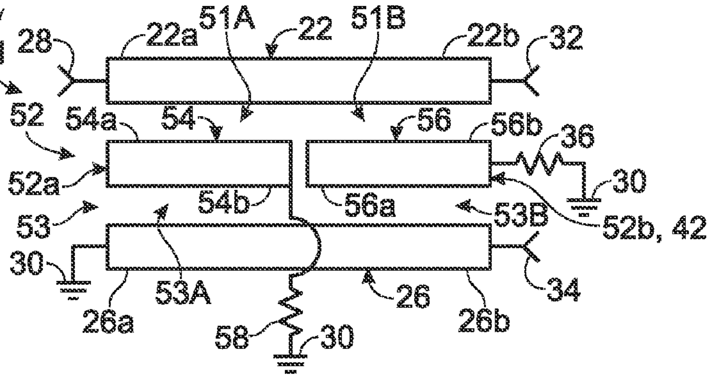
FIG. 2 is a diagram similar to FIG. 1 showing a three-conductor balun with one conductor having two segments.

A further example of a balun 20 is illustrated generally at 50 in FIG. 2. Like parts are given the same numbers as those for balun 20. Hence, balun 50 includes a first transmission line 51 formed by a first conductor 22 and a second conductor 52 and a second transmission line 53 formed by second conductor 52 and a third conductor 26. Conductor 22 has conductor ends 22*a* and 22*b*, conductor 52 has conductor ends 52*a* and 52*b*, and conductor 26 has conductor ends 26*a* and 26*b*. Unbalanced or difference port 28 is at conductor end 22*a*. Balanced signal ports 32 and 34 are at conductor ends 22*b* and 26*b*, respectively. Sum port 42 is at conductor end 52*b*. Conductor end 52*b* is connected to circuit ground 30 via resistor 36. Conductor end 24*a* is open circuited, and conductor end 26*a* is connected to circuit ground 30.

Balun 50 differs from balun 20 in that conductor 52 is a conductor assembly formed of two electrically spaced-apart conductor segments 54 and 56, both inductively coupled to conductors 22 and 26. Conductor segment 54 is proximate to first-conductor end 22*a*, and has a first conductor-segment end 54*a* that corresponds to conductor end 52*a*, is open circuited, and also is proximate to first-conductor end 22*a*. An opposite second conductor-segment end 54*b* is distal of first conductor end 22*a*, and is connected to circuit ground 30 through a resistor 58. Similarly, conductor segment 56 is proximate to first-conductor end 22*b*, and has a first conductor-segment end 56*a* that is open circuited and proximate to and spaced from second conductor-segment end 54*b*. An opposite second conductor-segment end 56*b* is proximate to first conductor end 22*b*, is connected to circuit ground 30 through resistor 36, and corresponds to conductor end 52*b* and sum port 42. Transmission lines 51 and 53 may be considered to have respective first transmission-line segments 51A and 53A associated with conductor segment 54, and second transmission-line segments 51B and 53B associated with conductor segment 56.

?Balun 20, as with baluns generally, functions well when conductors 22, 52, and 26 are ¼-wavelength long. However, when the signal has a frequency for which the balun conductors are ½-wavelength long, the short to ground on conductor end 26*a* appears as a short across one of output ports 32 and 34, eliminating the balance in the balanced-signal output. By dividing conductor 52 lengthwise into two conductor segments 54 and 56, balun 50 functions like balun 20 but may operate over a greater bandwidth with the two conductor segments being ¼-wavelength long when conductors 22 and 26 are ½-wavelength long.

Since the second conductor 52 is disposed between the first and third conductors 22 and 26 and is not connected to anything (is open circuited) at the unbalanced-signal end, the impedance between the first and third conductors at the unbalanced signal end is the sum of the impedances of the first and second transmission lines 38 and 40. The impedances of these transmission lines may be set to add up to about the impedance of the unbalanced line, which is 50 ohms in this example. Ideally, the second conductor 24 follows an equipotential line between conductors 22 and 26. However, there is a voltage drop along the third conductor 26 from the grounded end 26*a* to the balanced output terminal.

Under balanced conditions and for equal unbalanced and balanced signal voltages, the voltage to ground at the balanced ports 32 and 34 is half the unbalanced input voltage. Half way down third conductor 26 the voltage is about ¼ the unbalanced-signal input voltage. At that point, the voltage on the "hot" first conductor 22 is ¾ the input voltage. For example, if the transmission-line segment 53A has an impedance of 12.5-ohms and transmission-line segment 51A has an impedance of 37.5-ohms along first conductor segment 52 and both transmission lines have an impedance of 25-ohms, then the voltage at the midway point of the balun at conductor-segment end 52*b* will be essentially zero. The termination to circuit ground 30 through resistor 58 at this point ideally has no effect, as long as the output of the balun on ports 32 and 34 is balanced to ground. This assumes the impedances of second transmission-line segments 51B and 53B are each 25-ohms. However, any imbalance in the output results in power being dissipated in the termination through resistor 58. This design may perform well over a bandwidth that covers nearly a decade with good input match, and with about two octaves of good isolation between output ports.

Figure 3:
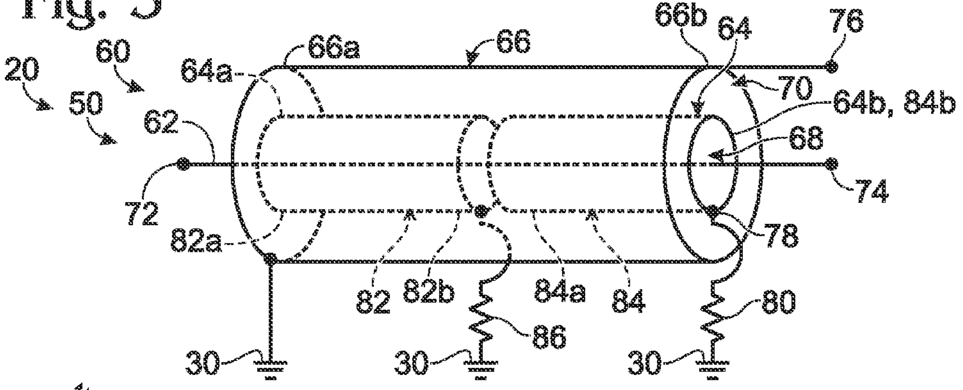
FIG. 3 is a diagram of a concentric coaxial version of the balun of FIG. 2.

FIG. 3 illustrates at 60 a coaxial embodiment of balun 50. Balun 60 includes a center conductor 62, a cylindrical intermediate conductor 64 radially surrounding and coaxial with center conductor 62, and a cylindrical outer conductor 66 radially surrounding and coaxial with both conductors 62 and 64. Conductors 62 and 64 form an first, inner transmission line 68 formed by conductors 62 and 64 and an second, outer transmission line 70 formed by conductors 64 and 66. Center conductor 62 has ends 62*a* and 62*b*, intermediate conductor 64 has conductor ends 64*a* and 64*b*, and outer conductor 66 has conductor ends 66*a* and 66*b*. An unbalanced-signal or difference port 72 is at center-conductor end 62*a*. Balanced-signal ports 74 and 76 are at center-conductor and outer-conductor ends 62*b* and 66*b*, respectively. A sum port 78 is at intermediate-conductor end 64*b*. Intermediate-conductor end 64*b* is connected to circuit ground 30 via a shunt resistor 80. Intermediate-conductor end 64*a* is open circuited, and outer-conductor end 66*a* is connected to circuit ground 30.

As shown, intermediate-conductor 64 is a conductor assembly formed of two electrically distinct or spaced-apart conductor segments 82 and 84, both inductively coupled to conductors 62 and 66. Conductor segment 82 is proximate to center-conductor end 62*a*, and has a first conductor-segment end 82*a* that is open circuited and also proximate to center-conductor end 62*a*. An opposite second conductor-segment end 80*b* is distal of center-conductor end 62*a*, and is connected to circuit ground 30 through a shunt resistor 86. Similarly, conductor segment 84 is proximate to center-conductor end 62*b*, and has a first conductor-segment end 84*a* that is open circuited and proximate to and spaced from second conductor-segment end 82*b*. An opposite second conductor-segment end 84*b* is proximate to center-conductor end 62*b*, is connected to circuit ground 30 through resistor 80, and corresponds to sum port 78.

The general discussion above with regard to baluns 20 and 50 illustrated in FIGS. 1 and 2 apply to balun 60 as well. Further, since intermediate conductor 64 surrounds center conductor 62, center conductor 62 is substantially isolated from outer conductor 66. This enhances the effect of the segmented intermediate conductor.

It will therefore be appreciated from the foregoing that an example has been provided of a balun that includes a second conductor with at least first and second spaced-apart conductor segments extending serially between the first and second ends of the second conductor, with each conductor segment having first and second ends and being inductively coupled to the first and third conductors, with the first end of each conductor segment being closer to the first end of the first conductor than the second end of the first conductor and being unconnected to the first conductor, the third conductor, and the circuit ground. The second end of each conductor segment is closer to the second end of the first conductor than the first end of the first conductor, the first end of the first conductor segment is the first end of the second conductor and the second end of the second conductor segment is the second end of the second conductor. The balun further includes a resistor connecting the second end of each conductor segment to the circuit ground, including a first resistor connecting the second end of the second conductor segment to the circuit ground and a second resistor connecting the second end of the first conductor segment to the circuit ground.

Figure 4:
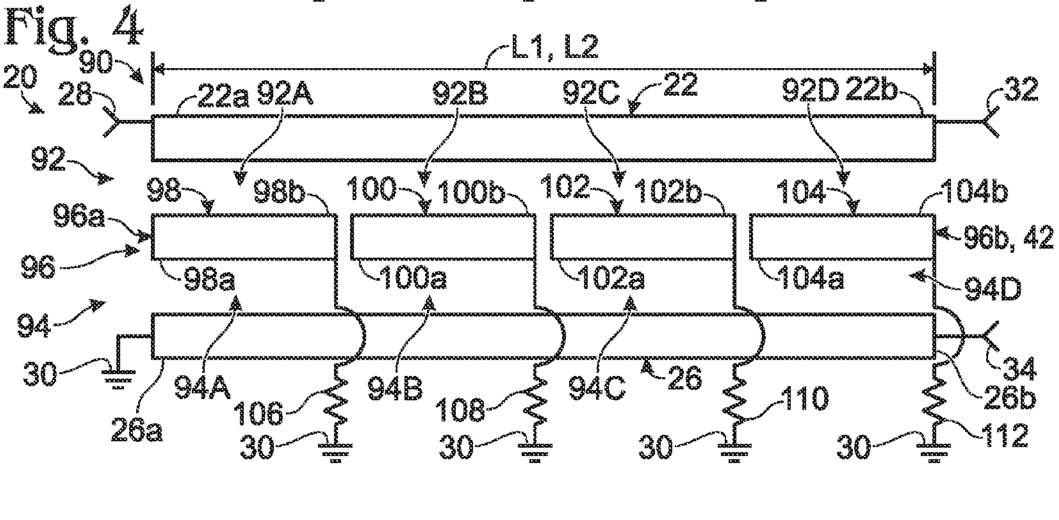
FIG. 4 is a diagram similar to FIG. 2 showing a three-conductor balun with one conductor having four segments.

A further example of baluns 20 and 50 is illustrated generally at 90 in FIG. 4. Like parts are given the same numbers as those for balun 20. Balun 90 includes first and second transmission lines 92 and 94. First transmission line 92 may be formed by a first conductor 22 and a second conductor 96. Second transmission line 94 may be formed by second conductor 96 and a third conductor 26. Conductor 22 has conductor ends 22*a* and 22*b*, conductor 96 has conductor ends 96*a* and 96*b*, and conductor 26 has conductor ends 26*a* and 26*b*. Unbalanced or difference port 28 is at conductor end 22*a*. Balanced signal ports 32 and 34 are at conductor ends 22*b* and 26*b*, respectively. Sum port 42 is at conductor end 96*b*. Conductor end 96*b* is connected to circuit ground 30 via resistor 36. Conductor end 96*a* is open circuited, and conductor end 26*a* is connected to circuit ground 30.

Balun 90 differs from balun 20 in that conductor 96 is a conductor assembly formed of four electrically distinct or spaced-apart conductor segments 98, 100, 102, and 104, all inductively coupled to conductor 22 along length L1 and inductively coupled to conductor 26 along length L2. Lengths L1 and L2 are equal in this example. Conductor segments 98, 100, 102, and 104 extend progressively along conductor 22 from conductor end 22*a* to conductor end 22*b*. Each conductor segment has a first conductor-segment end, such as ends 98*a*, 100*a*, 102*a* and 104*a*, that is proximate to first-conductor end 22*a* and that is open circuited. An opposite second conductor-segment end of each conductor segment, such as conductor-segment ends 98*b*, 100*b*, 102*b*, and 104*b*, is distal of first conductor end 22*a*, and is connected to circuit ground 30 through a resistor, such as resistors 106, 108, 110, and 112, respectively. Second-conductor-segment end 104*b* of conductor segment 104 corresponds to sum port 42.

Transmission lines 92 and 94 have respective transmission-line segments 92A and 94A associated with conductor segment 98, transmission-line segments 92B and 94B associated with conductor segment 100, transmission-line segments 92C and 94C associated with conductor segment 102, transmission-line segments 92D and 94D associated with conductor segment 104. The impedance values of the transmission-line segments and the impedances of resistors 106, 108, 110 and 112 are selected as appropriate for the particular application. That is, the impedances of the transmission-line segments are selected to transition the impedances between unbalanced-signal port 28 and balanced-signal ports 32 and 34.

The impedances of the transmission-line segments 92A and 94A are set to correspond with the impedance at unbalanced port 28. Similarly, where the balanced signal ports 32 and 34 are connected to or designed to be connected to a balanced signal, the impedances of the transmission-line segments 92D and 94D are set to correspond to the impedances of the balanced signal on ports 32 and 34. Where the balanced signal ports 32 and 34 are connected to or designed to be connected to respective unbalanced or single-ended signals, the impedances of transmission-line segments 92D and 94D are set to correspond to the respective impedances of the two unbalanced signals.

Correspondingly, the impedances of the intermediate transmission-line segments 92B, 92C, 94B, and 94C are set to progressively match the respective impedances at the unbalanced-port end and the balanced-port end. The table below gives impedances for the transmission-line segments and respective associated shunt resistors 106, 108, 110 and 112. The first example provides matching between a single 50-ohm unbalanced signal and a 50-ohm balanced signal or two 25-ohm single-ended signals. The second example provides matching between a single 50-ohm unbalanced signal and a 100-ohm balanced signal or two 50-ohm unbalanced signals.

Table of Representative Impedance Values, Ohms

Example 1

50-Ohm Unbalanced to 50-Ohm Balanced (25-Ohm Single-Ended)

| | Seg. A | Seg. B | Seg. C | Seg. D |
|---|---|---|---|---|
| Line 92 | 39 | 30.2 | 25.6 | 25 |
| Line 94 | 8.4 | 17.5 | 19.8 | 25 |
| Shunt R | 0 | 39.26 | 12.86 | 11.52 |

Example 2

50-Ohm Unbalanced to 100-Ohm Balanced (50-Ohm Single-Ended)

| | Seg. A | Seg. B | Seg. C | Seg. D |
|---|---|---|---|---|
| Line 92 | 44.4 | 41.3 | 40.16 | 40.1 |
| Line 94 | 10 | 20.3 | 31 | 47.7 |
| Shunt R | 0 | 14.83 | 16.24 | 17.29 |

It is seen that the resistor connected to the end of transmission-line segment A in both of these examples is zero-ohms, which is equivalent to a short. The others have values generally less that the impedances of the associated unbalanced and balanced signals. Also, the impedances for each transmission line vary progressively between the first and second ends of the first and third conductors and have values generally about or between the impedances of the circuits to which they are attached. For example, the balun of Example 1 is for connecting a 50-ohm unbalanced circuit to a 50-ohm balanced circuit. The impedances of the transmission-line segments in transmission line 92 vary between 50-ohms, the unbalanced-signal circuit impedance, and 25-ohms, one-half the balanced-signal circuit impedance. Similarly, the impedances of the transmission-line segments in transmission line 94 vary between 0-ohms, the impedance to ground on conductor end 26*a*, and 25-ohms, one-half the balanced-signal circuit impedance.

Figure 5:
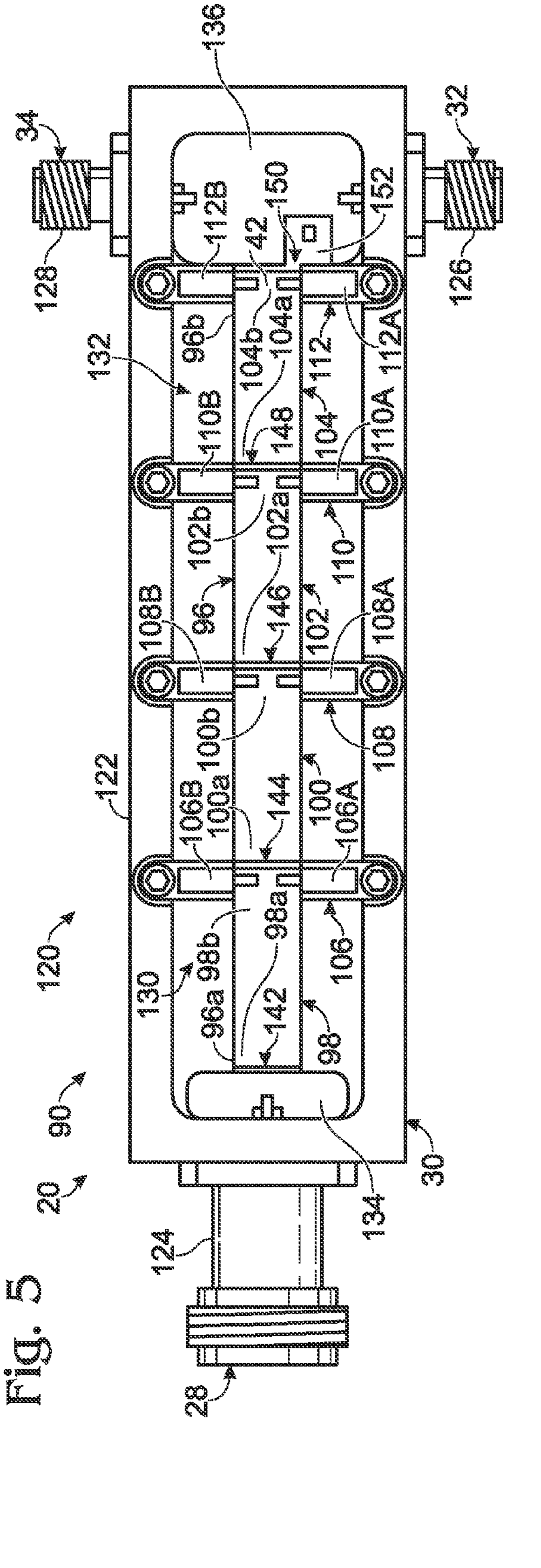
FIG. 5 is a top view of a balun assembly embodying the balun of FIG. 4.

FIGS. 5-10 illustrate a balun assembly 120 including an example of a balun 20 or balun 90. In this example, balun assembly 120 includes an electrically conductive housing 122, external coaxial connectors 124, 126 and 128 extending from housing 122, and a balun 130 mounted within the housing. FIG. 5 is a top view of balun assembly 120 with one face of housing 122 removed to expose balun 130 mounted in the interior of the housing. Housing 122 forms a complete enclosure and electromagnetic shield for balun 130, as well as serving as circuit ground 30.

Connector 124 is used to connect a 50-ohm coaxial line to balun 130, and can serve as unbalanced-signal port 28. In this example, connectors 126 and 128 are used to connect 25-ohm dual, unbalanced-signal coaxial lines or 50-ohm balanced-signal lines to balun 130.

Figure 6:
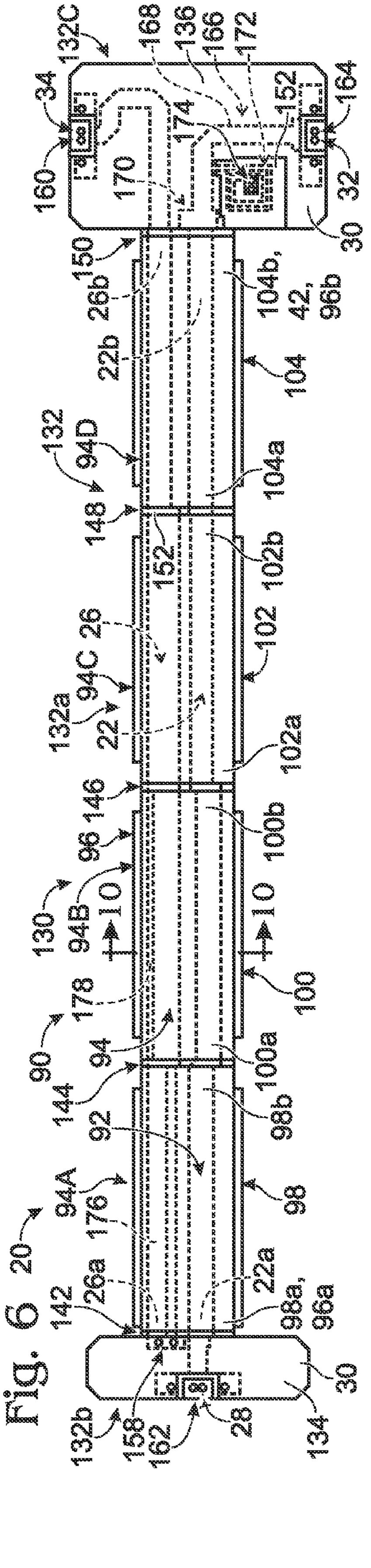
FIG. 6 is a top view of a printed-circuit board (PCB) assembly included in the balun assembly of FIG. 5.
Figures 7, 8, 9:
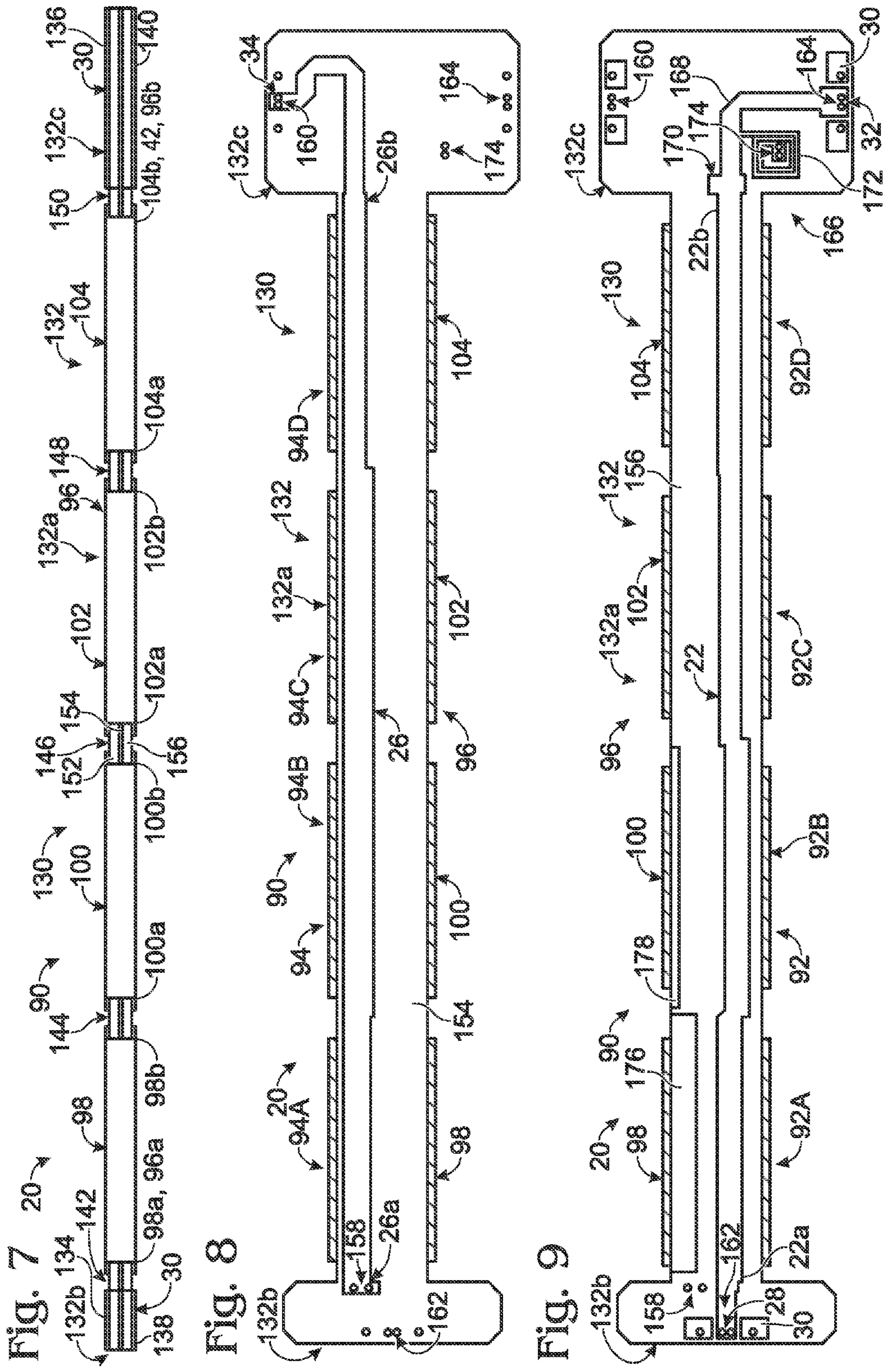
FIG. 7 is a side view of the PCB assembly of FIG. 6.
FIG. 8 is a top view of a first conductor layer of the PCB assembly of FIG. 6.
FIG. 9 is a top view of a second conductor layer of the PCB assembly of FIG. 6.

Balun 130 includes a multi-layered printed circuit-board (PCB) assembly 132 containing transmission lines 92 and 94. Shown in FIG. 6 is a top view of PCB assembly 132, which has an elongate intermediate section 132*a* separating opposite laterally enlarged ends 132*b* and 132*c*. In this view, the exposed faces of PCB-assembly ends 132*b* and 132*c* are covered with respective grounded electrically conductive layers 134 and 136. The bottom faces of enlarged ends 132*b* and 132*c* of the PCB assembly 132, opposite the faces including conductive layers 134 and 136, are covered with respective conductive layers 138 and 140, as shown in FIG. 7. FIG. 7 is a side view of the PCB assembly. The exposed faces of intermediate section 132*a* are covered with conductor 96, including conductor segments 98, 100, 102, and 104. As is shown particularly in the cross-sectional view in FIG. 10, the conductor segments surround conductors 22 and 26 in a rectangular, generally coaxial configuration, with the common axis extending along the length of intermediate PCB-assembly section 132*a*.

Gaps exist between the conductor segments and also between conductive layers 134 and 136 and the conductive segments 98 and 104, respectively. More specifically, a gap 142 separates conductive layer 134 from conductive segment 98. A gap 144 separates conductive segments 98 and 100. A gap 146 separates conductive segments 100 and 102. A gap 148 separates conductive segments 102 and 104, and a gap 150 separates conductive segment 104 and conductive layer 136.

The bottom face of PCB assembly 132 is similarly covered with a conductive layer divided into spaced-apart conductor segments and end ground layers separated by gaps 142, 144, 146, 148, and 150. FIG. 7 shows a side view of PCB assembly 132, which side includes conductive layers forming part of conductor segments 98, 100, 102, and 104 separated by respective gaps 144, 146, and 148. The widths of the gaps differ between major faces and the sides due to manufacturing tolerances for different processes used to layer the faces and sides. The opposite side of PCB assembly 132 is a mirror image of FIG. 7.

Shunt resistors 106, 108, 110 and 112 are provided as respective resistor pairs 106A and 106B, 108A and 108B, 110A and 110B, and 112A and 112B, connecting the respective conductive segment ends to ground, as described for balun 90.

Figure 10:
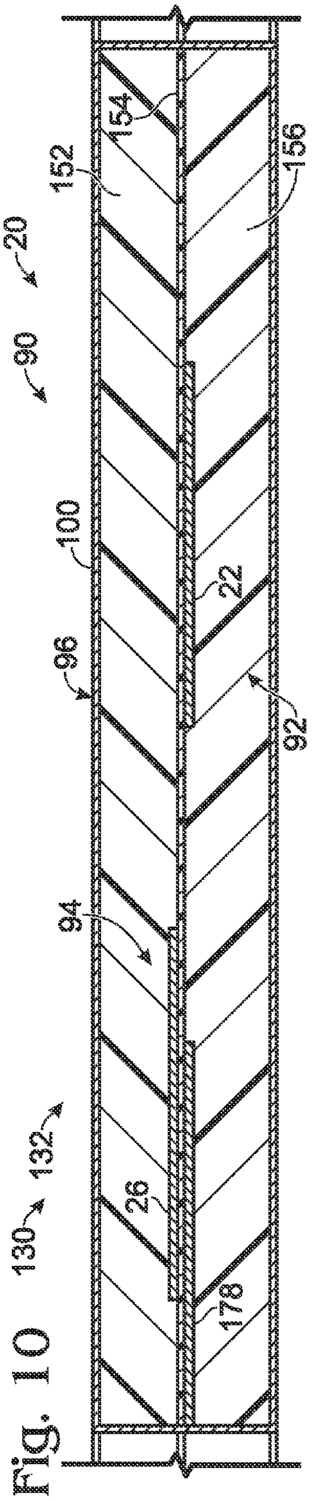
FIG. 10 is a cross section taken along line 10-10 in FIG. 6

As shown particularly in FIGS. 7 and 10, PCB assembly further includes a first outer dielectric layer 152 separating the conductor segments and end conductive layers 134 and 136 from conductor 26, an intermediate layer 154 separating conductor 26 from conductor 22, and a second outer dielectric layer 156 separating conductor 22 from the conductor segments and associated end conductive layers 138 and 140.

A top view of conductor 26 on intermediate dielectric layer 154 is shown in FIG. 8. Conductor end 26*a* is connected to circuit ground 30 through inter-layer conductors or vias 158 extending through layers 152, 154, and 156 to ground layers 134 and 138. End 26*b* is connected to connector 128 through vias 160. FIG. 9 shows a top view of conductor 22 on outer dielectric layer 156. End 22*a* is connected to connector 124 through vias 162, and end 22*b* is connected to connector 126 through vias 164.

Further, compensating impedance may be provided to improve performance over a wider bandwidth. For example, a compensating impedance 166 is provided on a transitional conductor 168 extending between conductor end 22*b* and an external circuit connected to connector 128, as shown in FIG. 9. Impedance 166 includes a shunt capacitor 170 in the form of tabs extending from conductor 168 providing increased capacitance to circuit ground. Additionally, impedance 166 includes a shunt inductor 172 coupling conductor 168 to circuit ground through vias 174. Capacitor 170 and inductor 172 form a parallel resonant circuit that improves isolation between ports 32 and 34 over a broader bandwidth.

PCB assembly 132 is configured to provide impedances in transmission line segments 92A-92D and 94A-94D appropriate for the particular application. The configurations shown generally represent, though not to scale, a configuration that provides the impedances shown in the impedance table above. The shape and position of conductors 22 and 26 within outer and intermediate conductor 96, as well as the characteristics and dimensions of the dielectric layers are designed to provide these impedances. In one example for operation between 0.8 GHz and 4.2 GHz, dielectric layers 152 and 156 are 0.31-inches (7.87-mm) thick and dielectric layer 154 is 5-mils (0.127-mm) thick, and made of a PTFE composite, such as RT/Duroid® 5880 made by Rogers Corporation of Chandler, Ariz., U.S.A. The conductors and conductive layers may be made of a suitable conductor, such as 1-oz. copper. The length of PCB assembly 132 may be less than 4-inches (10-cm) for the given operating frequency band.

In some applications, the impedances of the transmission-line segments may not readily be provided by varying the dimensions of the traces forming conductors 22 or 26, within manufacturing tolerances. Further adjustment in impedances may be achieved by varying the effective spacing or coupling between segmented conductor 96 and conductors 22 and 26. For example, in balun 130 the impedances for transmission line segments 94A and 94B are reduced by extending associated segments of conductor 96 into closer proximity to conductor 26.

Specifically and as shown in FIGS. 6 and 9, a conductive element 176 extends along substantially the length of conductor segment 98 and is connected along the length of one side to conductor segment 98. Conductive element 176 is coplanar with conductor 22 and extends along and is spaced from conductor 26, as shown particularly in FIG. 6. Conductive element 176 has a width appropriate for it to overlap (as viewed in FIG. 6) with most of the width of conductor 26.

Similarly, a second conductive element 178 extends along substantially the length of conductor segment 100 and is connected along the length of one side to conductor segment 100. Conductive element 178 is also coplanar with conductor 22 and extends along and is spaced from conductor 26, as shown particularly in FIGS. 6 and 10. Conductive element 178 has a width appropriate for it to overlap (as viewed in FIG. 6) with less than half of the width of conductor 26. The reduced spacing between the conductors in the transmission-line segments results in reduced impedances for the transmission-line segments. The resulting impedance of transmission-line segment 98 is substantially less than that of transmission line due to the greater overlap of the conductor segment. As a result, impedances as shown in the table above may be realizable without a significant increase in the width of continuous conductors, such as conductor 26 in this example.

Figure 11:
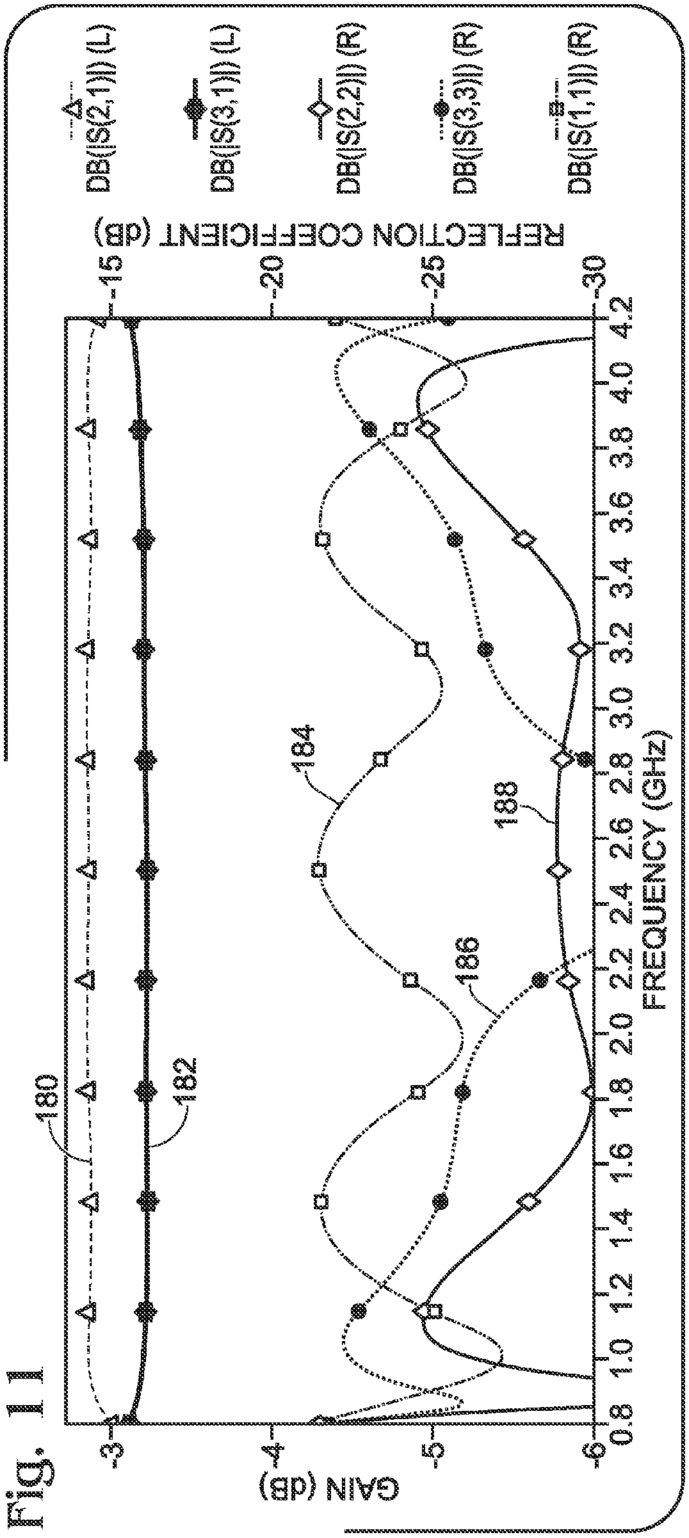
FIG. 11 is chart illustrating operating characteristics of an embodiment of the balun assembly of FIG. 5.

FIG. 11 is a plot of various performance parameters over the frequency band of 0.8-GHz to 4.2-GHz of an embodiment of balun assembly 120 having the impedances listed in the first example of the impedance table. Line 180 represents the gain on port 32 for a signal applied on port 28. Similarly line 182 represents the gain on port 34 for a signal applied on port 28. It is seen that the gain is close to −3-dB. The reflection coefficient at port 28, represented by line 184, and the reflection coefficient at port 34, represented by line 186, are seen to be below about 21-dB. The reflection coefficient at port 32, represented by line 188, is below about 24 dB.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of baluns, couplers, and combiner/dividers have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

INDUSTRIAL APPLICABILITY

The methods and apparatus described in the present disclosure are applicable to telecommunications, signal processing systems, and other applications in which radio-frequency devices and circuits are used.

The invention claimed is:

1. A balun comprising:

a first transmission line including a first conductor and a second conductor, the first conductor having a first end for conducting a signal relative to a circuit ground and a second end for conducting a balanced signal, the second conductor having first and second ends, the first end of the second conductor being open-circuited and disposed proximate to the first end of the first conductor, the second end of the second conductor being proximate to the second end of the first conductor;

a first resistor connecting the second end of the second conductor to circuit ground; and a second transmission line including the second conductor and a third conductor, the third conductor having a first end proximate to the first end of the second conductor and connected to the circuit ground and a second end for conducting the balanced signal.

2. The balun of claim 1, wherein the second conductor includes at least first and second spaced-apart conductor segments extending serially between the first and second ends of the second conductor, with each conductor segment having first and second ends and being inductively coupled to the first and third conductors, with the first end of each conductor segment being closer to the first end of the first conductor than the second end of the first conductor and being open-circuited; and the second end of each conductor segment being closer to the second end of the first conductor than the first end of the first conductor, the first end of the first conductor segment being the first end of the second conductor and the second end of the second conductor segment being the second end of the second conductor, the balun further comprising a resistor connecting the second end of each conductor segment to the circuit ground including the first resistor connecting the second end of the second conductor segment to the circuit ground and a second resistor connecting the second end of the first conductor segment to the circuit ground.

3. The balun of claim 2, wherein each conductor segment surrounds a respective portion of the first conductor.

4. The balun of claim 3, wherein each conductor segment also surrounds a respective portion of the third conductor.

5. The balun of claim 4, wherein the first and third conductors are respectively coupled more closely to the second conductor than to the other of the first and third conductors.

6. The balun of claim 3, wherein the third conductor surrounds the first and second conductors.

7. The balun of claim 2, wherein the first unbalanced-signal port is designed to be connected to a circuit having an unbalanced-signal impedance relative to the circuit ground and the first and second balanced-signal ports are designed to be connected to a circuit having a balanced-signal impedance between the first and second balanced-signal ports, and the first and second transmission lines each includes a transmission-line segment associated with each conductor segment, each of the transmission-line segments has an associated impedance, and the impedances of the transmission-line segments are appropriate to produce substantially no voltage relative to the circuit ground at the second ends of the second conductor.

8. The balun of claim 7, wherein the impedances of the transmission-line segments of the first transmission line vary progressively in value from the unbalanced-signal port to the associated balanced-signal port.

9. The balun of claim 7, wherein the impedances of the transmission-line segments of the second transmission line have impedances that vary progressively in value from proximate the unbalanced-signal port to the associated balanced-signal port.

10. The balun of claim 2, wherein the first and third conductors extend continuously from the respective first end to the respective second end.

11. The balun of claim 2, wherein the conductor segments are each of substantially equal electrical lengths.

12. The balun of claim 1, wherein the second conductor surrounds the first conductor.

13. The balun of claim 12, wherein the second conductor also surrounds the third conductor.

14. The balun of claim 13, wherein the first and third conductors are respectively inductively coupled more closely to the second conductor than to the other of the first and third conductors.

15. The balun of claim 12, wherein the third conductor surrounds the first and second conductors.

16. The balun of claim 1, wherein the first unbalanced signal port is designed to be connected to a circuit having a first impedance relative to the circuit ground and the first and second balanced-signal ports are designed to be connected to a circuit having a second impedance between the first and second balanced-signal ports, and the first transmission line has an impedance between the first impedance and half the second impedance.

17. A balun comprising:

a first conductor having a continuous length between a first end for conducting a signal relative to a circuit ground and a second end for conducting a balanced signal with a first polarity, a second conductor inductively coupled to the first conductor substantially along the length of the first conductor, and having first and second ends, the first end of the second conductor being open-circuited and disposed proximate to the first end of the first conductor, the second end of the second conductor being proximate to the second end of the first conductor;

a first resistor connecting the second end of the second conductor to a circuit ground; and a third conductor having a continuous length extending between a first end proximate to the first end of the second conductor and a second end proximate to the second end of the second conductor, the first end of the third conductor connected to the circuit ground, the second end of the third conductor for conducting the balanced signal with a second polarity opposite the first polarity, the second conductor being inductively coupled to the third conductor substantially along the length of the third conductor.

18. The balun of claim 17, wherein the first and third conductors are respectively inductively coupled more closely to the second conductor than to the other of the first and third conductors.

19. The balun of claim 17, wherein the second conductor surrounds the first conductor.

20. The balun of claim 19, wherein the second conductor also surrounds the third conductor.

21. The balun of claim 17, wherein the second conductor includes at least first and second spaced-apart conductor segments extending serially between the first and second ends of the second conductor.

* * * * *